United States Patent [19]

Mossey

[11] Patent Number: 4,610,540

[45] Date of Patent: Sep. 9, 1986

[54] FREQUENCY BURST ANALYZER

[75] Inventor: Paul W. Mossey, Greenhills, Ohio

[73] Assignee: General Electric Company, Cincinnati, Ohio

[21] Appl. No.: 395,570

[22] Filed: Jul. 6, 1982

[51] Int. Cl.$^4$ .......................... G01P 3/36; G01R 23/02
[52] U.S. Cl. ................................. 356/28.5; 324/77 R; 324/78 R; 343/5 SA
[58] Field of Search ............................ 324/77 E, 78 F; 356/28.5; 343/5 SA

[56] References Cited

U.S. PATENT DOCUMENTS

| 3,215,934 | 11/1965 | Sallen | 343/5 SA |
|---|---|---|---|
| 3,303,420 | 2/1967 | Harris et al. | 324/77 |
| 3,422,348 | 1/1969 | Gutleber | 324/77 |
| 3,593,165 | 7/1971 | Grubbs, Jr. | 328/149 |
| 3,697,988 | 10/1972 | Klausner | 343/5 SA |
| 3,738,750 | 6/1973 | Kalb et al. | 356/28.5 |
| 3,806,929 | 4/1974 | Moore | 343/5 SA |
| 3,856,402 | 12/1974 | Low et al. | 356/28.5 |
| 3,984,685 | 10/1976 | Fletcher et al. | 356/28.5 |
| 4,051,433 | 9/1977 | Dimotakis et al. | 324/78 R |
| 4,069,482 | 1/1978 | Parker et al. | 343/7.7 |
| 4,377,961 | 3/1983 | Bode | 324/77 E |

Primary Examiner—S. C. Buczinski
Attorney, Agent, or Firm—Gregory A. Welte; Derek P. Lawrence

[57] ABSTRACT

An analyzer for determining the frequency of short bursts of radiation is disclosed. An input signal burst is fed to groups of filters and the filter in each group producing the largest output signal is identified. The frequency response characteristics of the filters identified, as well as the magnitudes of their output signals, are utilized in computation of the frequency of the input signal burst.

11 Claims, 14 Drawing Figures

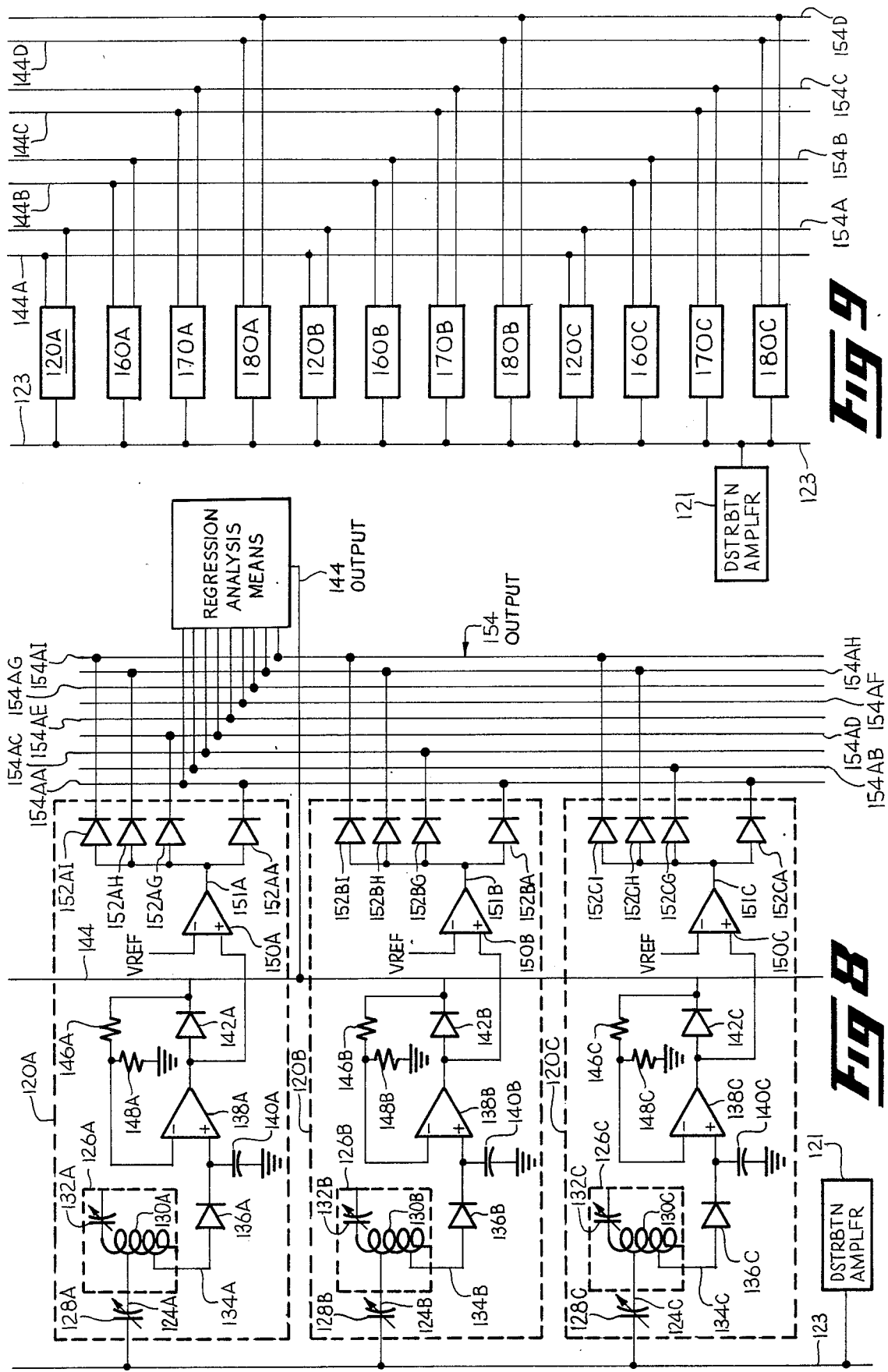

FREQUENCY BURST ANALYZER

The invention relates to analyzers for measuring the frequency of electromagnetic radiation in real-time, and, more particularly, to such analyzers for measuring the velocity of a fluid flow by projecting light into the fluid and measuring the frequency of reflected light by employing filters having overlapping pass bands.

BACKGROUND OF THE INVENTION

It is common to measure the frequency of electromagnetic radiation by counting the number of radiation cycles which occur during a known time interval. Such frequency counting is not, strictly speaking, a real-time measurement because it gives an average frequency taken over the time interval used. If the frequency should be greater at the beginning of the interval and lesser toward the end of the interval, this approach would not indicate that occurrence.

This fact limits the applicability of such an approach. For example, in an application where frequency measurement is to be used to indicate gas velocity in a jet engine, radiation such as light can be projected onto reflective particles such as dust or soot present in the gas flow. The radiation is reflected by the particles and a change in frequency of the reflected radiation due to the Doppler shift gives an indication of the speed at which the particles are moving and thus the speed of the moving gas. However, the gas can be moving so fast that the particles remain present in the vicinity where the velocity is to be measured for only a very short time before being swept away. Thus, they can reflect for only a similarly short time with the result that the reflected radiation is produced in bursts of extremely short duration. These frequency bursts do not persist for a long enough time to allow frequency counters to function well.

One alternative to utilizing frequency counters is to estimate the frequency by using a bank of bandpass filters spanning a spectrum of interest, each filter occupying a known sub-band of the spectrum. For example, a first filter can have a passband in the range of 0–10 Hertz, a second filter have a band in the range of 10–20 Hertz, and so on, up to a tenth filter having a band in the range of 90–100 Hertz. Thus, a spectrum from 0–100 Hertz would be covered and, for example, a signal from the second filter would indicate that the frequency of an input signal lies somewhere between 10 and 20 Hertz. However, this approach suffers the drawback that only a frequency range and not an exact frequency of the input signal is obtained. Further, the accuracy of the device is determined by the number of filters together with the passband of each. To obtain high accuracy, a large number of filters, each having a narrow passband, is required. Further still, to cover a large spectrum a proportionately larger number of filters is additionally required.

OBJECTS OF THE INVENTION

It is an object of the present invention to provide a new and improved substantially real-time frequency analyzer.

It is a further object of the present invention to provide a new and improved substantially real-time frequency analyzer capable of analyzing bursts of radiation of extremely short duration.

It is a further object of the present invention to provide a new and improved substantially real-time frequency analyzer providing high accuracy yet requiring a reduced number of bandpass filters.

It is a further object of the present invention to provide a new and improved system utilizing a substantially real-time frequency analyzer to measure fluid flow velocities.

It is a further object of the present invention to provide a new and improved system utilizing a substantially real-time frequency analyzer to measure fluid flow in a nondisturbing manner by means of a Doppler shift technique.

BRIEF DESCRIPTION OF THE DRAWING

FIG. 8 illustrates three filter cells of the present invention.

FIG. 9 illustrates the connection of 12 filter cells to 4 signal bus pairs.

SUMMARY OF THE INVENTION

The invention employs at least two groups of filters, each group containing one or more filters. An input signal having a frequency to be measured is applied simultaneously to all the filter groups. Each filter in each group provides a preliminary signal of magnitude determined by the frequency response characteristics of the particular filter. The filter in each group which provides the largest signal is identified. Information about the frequency response characteristics of these identified filters, such as center frequencies or a mathematical description of each response characteristic, is used in conjunction with the output signal magnitude corresponding to each in order to compute the frequency of the input signal.

In a preferred embodiment of the invention, monochromatic light, as from a laser, is projected onto moving particles, such as dust or soot, present in a moving fluid, such as a gas stream in a jet engine. Light reflected by the moving particles is shifted in frequency by the Doppler effect and the frequency of the shifted signal is measured by the apparatus described above in order to provide a measure of the velocity of the moving fluid stream.

DETAILED DESCRIPTION OF THE INVENTION

Figure 4:
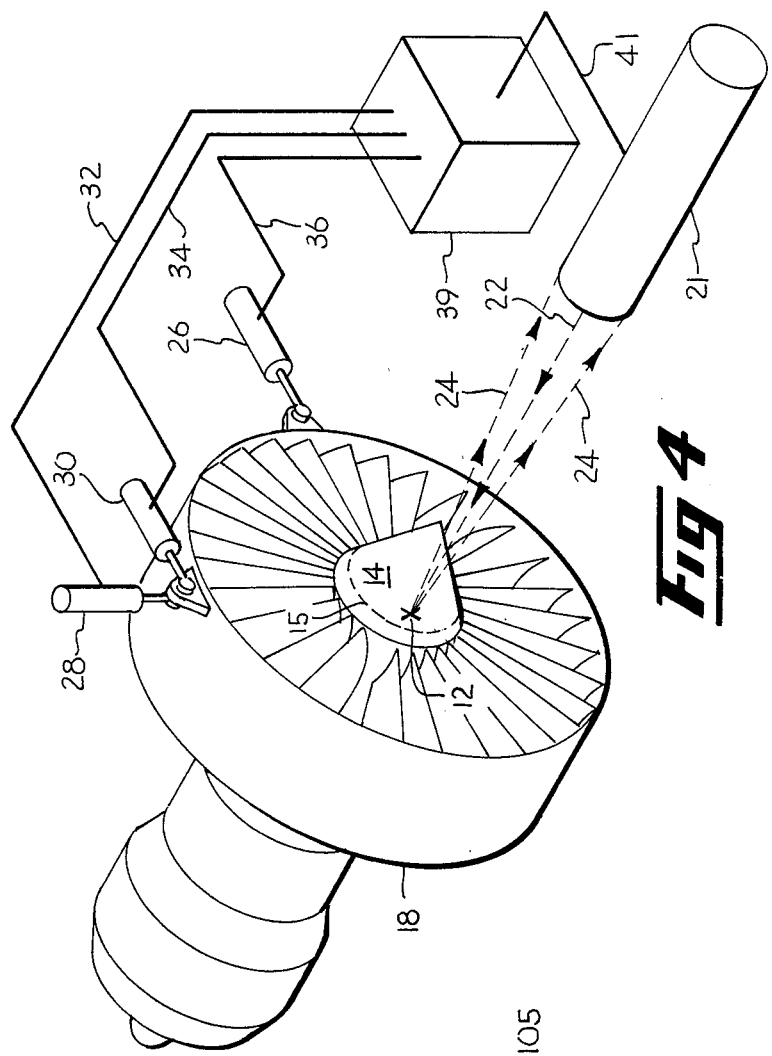
FIG. 4 schematically illustrates the present invention operating in conjunction with a jet engine.

Radiation which is reflected by a moving object is changed in frequency according to the Doppler Effect. As explained in the section below entitled General Considerations, this Effect can be used to determine the velocity of the object. For example, as shown in FIG. 4, the velocity of a moving stream of a fluid such as a gas located at a position 12 within a region 14 indicated by dotted line 15 is to be measured. Region 14 is contained within a jet engine, schematically illustrated as 18. An optical probe 21 contains optical components which project a beam of substantially monochromatic light 22 toward position 12 at which the light beam 22 is to be reflected and returned as a beam indicated as 24.

Engine 18 and unit 21 can be moved with respect to each other by mechanisms (not shown) to expose different particular positions of region 14 to illumination by light beam 22. For reference, the path generally followed by light beam 22 will be termed the optical axis. The particular location of position 12 with respect to a reference system is sensed by transducers 26, 28 and 30 which generate signals which are transmitted by leads 32, 34 and 36 to signal processing circuitry, schematically indicated as 39. The returning beam 24 is received by unit 21 which produces a velocity signal indicative of the frequency of the light in the returning beam 24 and thus of the velocity of the gas stream. The velocity signal is transmitted to the signal processing circuitry 39 by means of lead 41.

While a gas stream itself contained in jet engine 18 is normally transparent and not reflective of light, nevertheless, foreign particulate matter, such as dust or soot, is generally present in the gas stream and functions to reflect the light beam 22. Should such reflecting material be absent from the gas stream, suitable substitutions can be made. For example, soot can be artifically introduced by adjustments made to the combustion processes in the engine, or dust can be introduced from an external source not shown.

Figure 5:
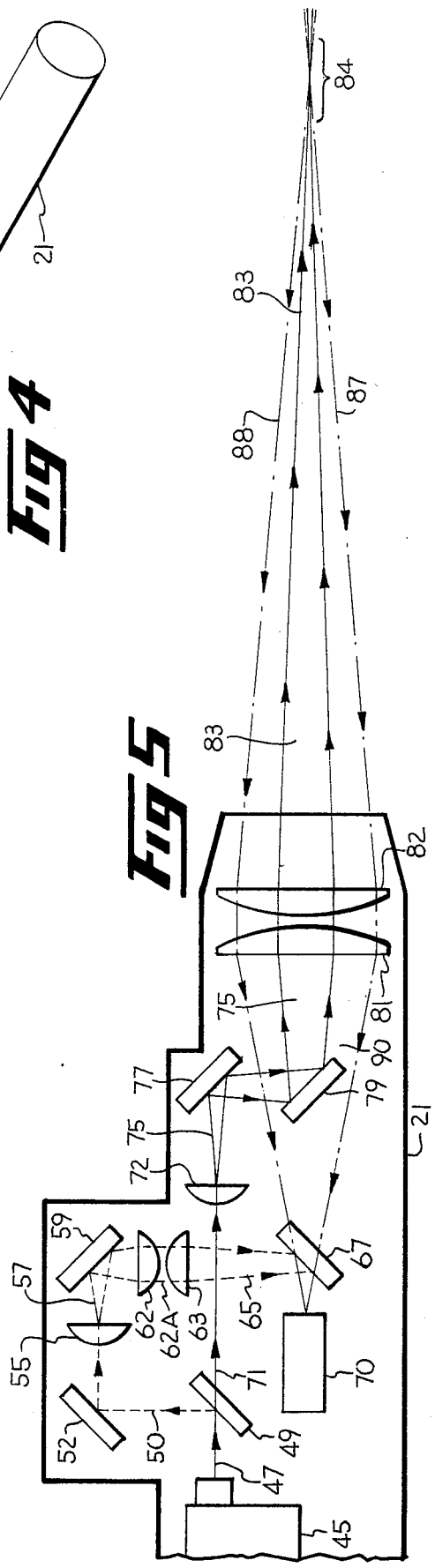
FIG. 5 is a cross-sectional view of the optical probe of the present invention.

FIG. 5 illustrates schematically the optical components contained within optical probe 21. A source of monochromatic light, such as a laser 45, projects a light beam 47 which impinges upon a beam splitter 49. Part 50 of the light beam 47 is reflected to reflecting means such as mirror 52 and reflected thereby to a focusing means such as lens 55. The latter expands the light beam into a diverging form illustrated as 57 which is reflected by a reflecting means such as mirror 59 to lens means 62. Lens means 62 functions to collimate the expanding beam 57. This reduces the amount of divergence and transforms the expanding beam 57 into one in which the light rays are substantially parallel. The collimated beam, indicated as 62A, is focused to a converging beam 65 by lens means 63. Beam 65 is reflected by a beamsplitter 67 to detector 70.

Beamsplitter 49 allows the remainder 71 of light beam 47 which is not reflected as beam part 50 to travel to a focusing means such as lens 72 which functions to diverge light beam 71 into a diverging beam 75. A reflecting means such as mirror 77 reflects the diverging beam 75 to a reflecting means such as mirror 79. The latter projects the diverging beam 75 in the same general direction as light beam part 71 but displaced in the vertical direction in the Figure. The diverging beam 75 is focused by focusing means such as lenses 81 and 82 into a converging beam 83 which narrows down in the region designated 84 to a substantially cylindrical portion of very small diameter which is termed a beam waist. It is in the beam waist region 84 that reflection by the dust and soot particles occurs and this region is located at position 12 shown in FIG. 1.

Light is reflected by the dust and soot particles in random directions in beam waist region 84 and some of it returns toward unit 21. Of this returning light, that light which strikes lens 82, namely that light which forms a diverging beam indicated by dotted lines 87 and 88, is focused by lenses 81 and 82 into a converging beam 90. Converging beam 90 strikes beamsplitter 67 and part of this beam passes through the beamsplitter 67 and thence to the detector 70.

It should be noted that lenses 81 and 82 perform a symmetrical function in that they focus the diverging beam 75 into the beam waist 84 as well as focus light 90 reflected from the beam waist 84 into beamsplitter 67. It should also be noted that the particle velocity measured is actually the velocity component in the direction of light beam 83.

Detector 70 multiplies, or heterodynes, the beam 65, which is herein sometimes termed a reference beam, with the reflected beam 90. Heterodyning is explained as follows: a light beam can be treated as a sine wave and thus mathematically described by an expression such as sine At, wherein A is a frequency constant and t represents time. Accordingly, the process of heterodyning can be described in terms of trigonometric identities. It is a mathematical fact that the expression (sine At)(sine Bt), meaning the sine of At multiplied by the sine of Bt, is equivalent to sine (At+Bt)+sine (At−Bt), meaning the sine of the sum of At and Bt plus the sine of the difference between At and Bt. Thus, multiplying two sine waves is equivalent to adding two sine waves of proper frequencies. In this example, the one frequency is A+B, and the other frequency is A−B.

Viewed another way, the multiplication of the two sine waves acts to transform them into a pair of waves of the frequencies just mentioned. Since, in the case of optical frequencies, the resulting wave represented by the term sine (A+B)t will be of an extremely high frequency, it can be ignored. One reason is that this frequency is beyond the range of the frequency analyzing circuitry to be described below. Consequently, the other term, sine (A−B)t, is left and its frequency contains the information from which the gas velocity is to be deduced.

Figure 6:
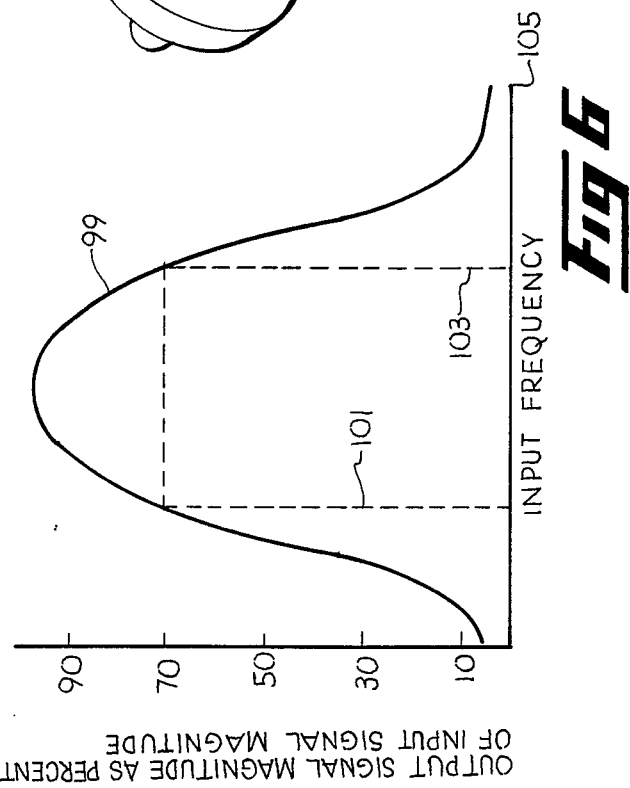
FIG. 6 is a plot of the transfer function of an electrical filter.

In order to explain the functioning of the frequency analyzing circuitry of the present invention, a simplified example of some of the operative principles will be given. FIG. 6 illustrates the frequency response characteristic 99, that is, the transfer function, of an electronic filter. This function indicates that for an input frequency, such as 101, an output signal is obtained which is, in magnitude, a percentage of the magnitude of the input signal. In the case of the frequency 101, an output magnitude of 70% is obtained. Similarly, an input signal of a frequency of 103 would produce an output signal of identical magnitude.

Three things should be noted at this point. (1) there is no definite cutoff to the frequencies to which the filter responds. That is, the transfer function 99 extends theoretically infinitely far to the right and to zero to the left. Thus, an input signal of frequency such as 105 will still generate an output signal, but of small magnitude. (2) The passband of the filter is commonly defined as the band of frequencies such as between 101 and 103 producing an output signal above some magnitude such as 70%. (3) The input signal is an alternating current (A.C.) signal, as is the output signal of the filter. Signal magnitude in such a case refers to a quantity related to the vertical distance between points 110 and 111 in FIG. 1C.

Further explaining the simplified example, several such filters having neighboring passbands can be used to cover a frequency spectrum of interest, although the present invention is not limited to the use of passband filters. The manner of accomplishing the frequency analysis is explained with reference to FIG. 7A. Filters having predetermined or known transfer function 115A–115D will each produce an output signal in response to an input signal. For example, an input signal of frequency 117 will result in output signals 119A–119D from the respective filters.

Figure 7A:
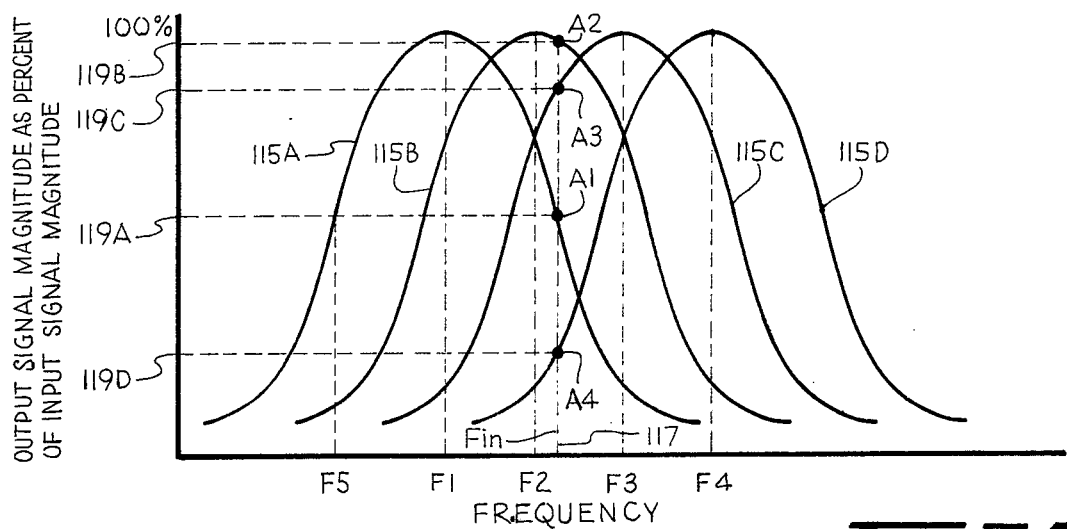
FIG. 7A is a plot of the transfer functions of four electrical filters having neighboring passbands.
Figure 7B:
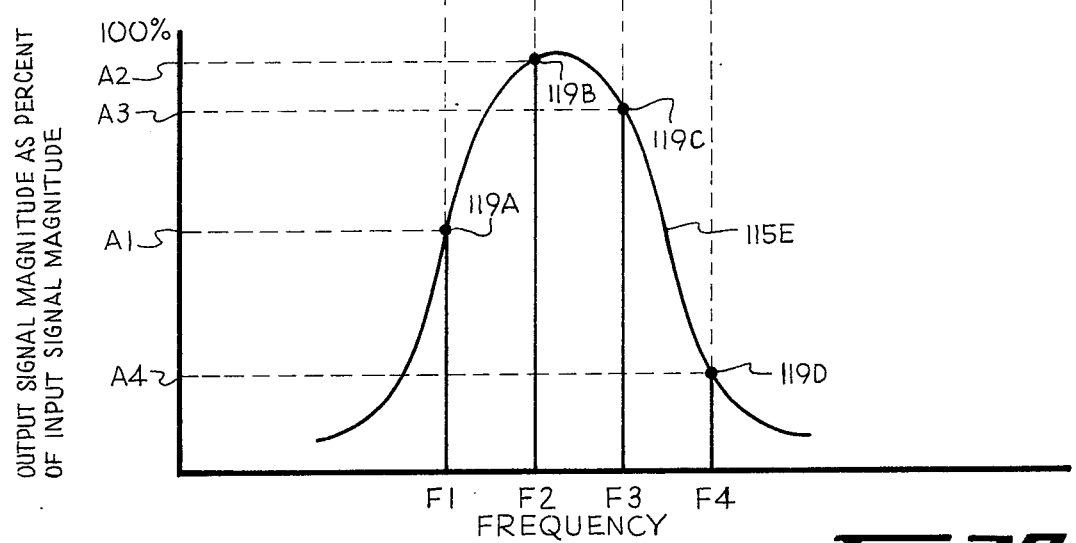
FIG. 7B is a rearrangement of some of the data of FIG. 7A.

The filter outputs of FIG. 7A are depicted differently in FIG. 7B. As the latter shows, two pieces of information are plotted for each filter: the filter's center frequency and the relative magnitude of the output signal with respect to the input signal of each. One method of estimating the input frequency is to obtain a weighted average of the frequencies in FIG. 7B. That is, to use an equation, such as the following, in which the symbols, such as $f_1$, refer to values shown in FIG. 7B:

$$\text{Input frequency } (f_{in}) = \frac{A_1 f_1 + A_2 f_2 + A_3 f_3 + A_4 f_4}{A_1 + A_2 + A_3 + A_4}$$

A more precise method of estimation is to use graphical curve fitting. This method requires the reconstruction of a figure identical to FIG. 7A utilizing the known filter transfer function and inserting the data pairs (amplitude and center frequency) into the Figure. (It is to be noted that, in using filters having the symmetrical transfer functions shown, such as function 115A, one amplitude, such as $A_1$, corresponds to two frequencies, namely $f_{in}$ and $f_5$. Thus, each data pair identifies a transfer function as well as two possible frequencies corresponding to the amplitude in the data pair). The frequency at which amplitude points, such as $A_1$, $A_2$, $A_3$, and $A_4$ in FIG. 7A, coincide is taken as the input frequency, which is $f_{in}$ in this case.

Another approach to curve fitting in the case when the transfer functions 115A–D are similar in shape is to slide one of the transfer functions left- and rightward in FIG. 7B until it covers the points 119A–D as does transfer function 115E. When this occurs, the center frequency of the sliding transfer function is taken as the input frequency.

Alternately, this graphical method can be accomplished by solving, either manually or by computer, the equations describing the transfer functions and inserting the data pairs obtained into the solution to obtain the input frequency.

Regardless of the method used to obtain the input frequency (weighted average, curve fitting or equation solution), the deducing of the input frequency is herein termed regression analysis. The following circuitry functions to provide the data pairs used in this simplified example.

The circuitry is comprised of numerous similar filter cells, three of which are shown enclosed in dotted lines 120A–C in FIG. 8. The structure of one such filter cell will be described. A distribution amplifier 121 supplies a ratio frequency (R.F.) signal distribution conduit or bus 123 which is connected by means of a variable capacitor 128A to the input 124A of a filter element indicated as dotted block 126A. Filter element 126A is depicted schematically as comprising an inductor 130A coupled in series with a variable capacitor 132A. It should be noted, however, that numerous other component configurations can be used to construct a suitable filter element. An output 134A of filter element 126A is connected to the input of a diode 136A, the output of which is connected to the noninverting input (+) of an operational amplifier (op-amp) 138A as well as to ground by means of a ripple filter such as capacitor 140A. The output of op-amp 138A is connected to the input of an isolation means such as diode 142A, the output of which is connected to a maximum analog signal bus 144 as well as to one terminal of resistor 146A. The other terminal of resistor 146A is connected to the inverting input (−) of op-amp 138A as well as to ground by means of resistor 148A. The output of op-amp 138A is further connected to the noninverting input (+) of comparator 150A, the inverting input (−) of which is connected to a reference voltage indicated as $V_{ref}$. The output 151A of comparator 150A is connected simultaneously to the inputs of encoder diodes 152AA–152AI, the outputs of which are connected to selected conduits, such as 154AA, 154AD, 154AH, and 154AI. These conduits, together with conduits 154AB, 154AC, 154AE, 154AF, and 154AG, form a digital signal identification bus 154.

One filter cell, namely 120A, has been described. All other filter cells are similar in structure except that the filter element of each is tuned to a different peak frequency so that the transfer functions of the three filter elements 126A–C overlap as do three of the transfer functions in FIG. 7A. The encoder diodes of each filter cell are connected to a unique combination of conduits in the digital signal bus 154. This unique connection allows each filter cell to generate a signal on this bus 154 in order to identify itself. Because of the similarity of structure of all the filter cells, the components within them, such as in filter cells 120B and 120C shown in FIG. 8, are labeled analogously to those of cell 120A (e.g., diode 136B is analogous to diode 136A). The description given above for cell 120A applies to cells 120B and 120C as well, and a given component, such as diode 136B, may be described generically herein as diode 136, meaning all diodes 136A, 136B, 136C, and so on.

The maximum analog signal bus 144 and the digital signal bus 154 form one pair of a plurality of pairs of such buses, four pairs of which (144A and 154A, 144B and 154B, 144C and 154C, 144D and 154D) are shown in FIG. 9. The peak analog signal buses are designated as 144A–D and the digital signal buses (shown in FIG. 9 as single conduits unlike the multiple-conduit illustration of FIG. 8) are designated 154A–D. The cells 120A–C of FIG. 8 are shown as blocks 120A–C which are connected between R.F. distribution bus 123 and the pair of busses 144A and 154A. Analogous cells 160A–C are connected between R.F. distribution bus 123 and bus pair 144B and 154B; cells 170A–C are connected between R.F. distribution bus 123 and bus pair 144C and 154C and cells 180A–C are connected between R.F. distribution bus 123 and bus pair 144D and 154D. In this example, three filter cells have been shown connected to each bus pair. However, the actual number to be used in the invention is determined by the desired range of frequency measurement and is thus the user's choice.

Figure 10:
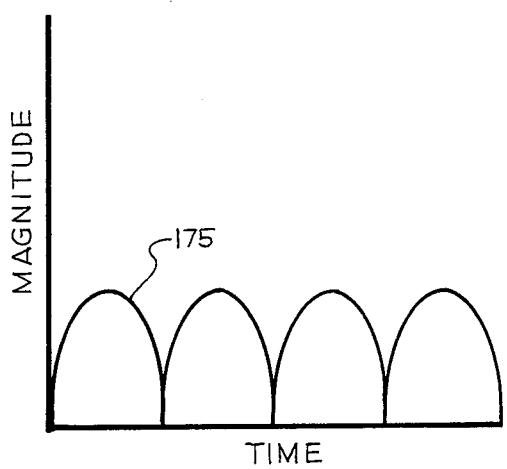
FIG. 10 illustrates the rectified output of a filter element.
Figure 11:
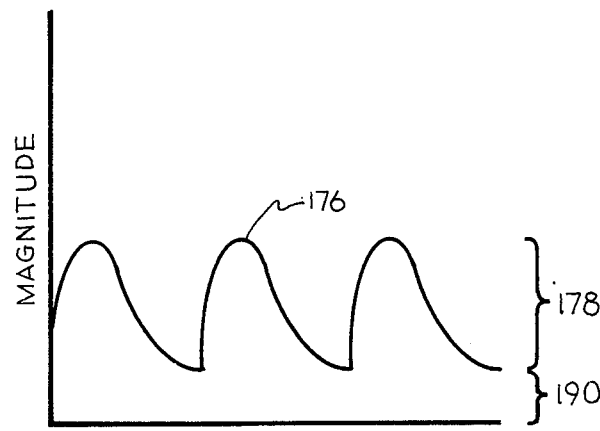
FIG. 11 illustrates the rectified output of FIG. 10 following further processing to remove ripple.

The functioning of one of the filter cells connected to output signal bus pair 144A and 154A, is now described. The R.F. signal produced by the heterodyning operation which occurs in detector 70 in FIG. 5 is applied the input 124A of filter element 126A by means of capacitor 128A of FIG. 8. A preliminary signal is produced at the output 134A of filter element 126A and will depend in magnitude upon the particular transfer function of the filter element 126A. The preliminary signal is applied to the input of diode 136A and rectified by it to produce a signal 175, resembling that shown in FIG. 10. The ripple in the rectified signal is smoothed out by capacitor 140A to provide a signal 176 which would, speaking generally, resemble that shown in FIG. 11 and which is a signal having a smaller ac component 178 and a larger minimum component 190 than the input signal 175 to diode 140a. Thus, a signal which may be viewed as a dc signal and which is related in magnitude to that of the preliminary signal is applied to the noninverting input of op-amp 138A.

The particular interconnection of op-amp 138A with op-amps 138B and 138C results in the identification of the one receiving the largest preliminary signal 176. Further, the op-amp identified generates a signal which is applied to the analog signal bus 144 which is indicative of the magnitude of that largest signal. This will be explained by an example.

Let it be assumed that the input voltages to diodes 142A-C are 1, 2, and 3 volts, respectively. Then the voltage of analog signal bus 144 will be pulled to 3 volts minus the voltage across diode 142C, the latter being of the order of one-half volt. Thus, analog signal bus 144 stands at about 2.5 volts. Since diode 142C is conducting, a feedback loop is completed for op-amp 138C through resistors 146C and 148C which, depending on the values of these resistors, may or may not act through op-amp 138C to increase the voltage at the input of diode 142C. However, with respect to diodes 142A and 142B, the voltage on analog signal bus 144 is more positive than their input voltages. Thus, they are reverse-biased or weakly forward-biased and can be treated as open circuits. This results in the feedback loops being broken to each of op-amps 138A and 138B. This reduces the amplification of each and will lower the originally postulated voltages of 1 and 2 volts applied respectively to diodes 142A and 142B. Viewed another way, the signal on analog signal bus 144 is fed back to the inverting (−) inputs of op-amps 138A and 138B and these op-amps interpret this signal as actually being their own respective output signals. In response, op-amps 138A and 138B tend to decrease their outputs because they interpret their outputs as being too large, with the result that diodes 142A and 142B, in effect, become open circuits as described above. Accordingly, only the signal from op-amp 138C is transmitted to analog signal bus 144. Thus, when equilibrium is reached, a signal indicative of the magnitude of the largest preliminary output voltage among the filter cells 120A-C is applied to analog signal bus 144.

In addition to being applied to analog signal bus 144, the output of op-amp 138C is connected to the noninverting input of comparator 150c. Completion of the feedback loop of op-amp 138C as described above brings the voltage of the output of op-amp 138C to a level sufficient to trigger this comparator. Failure to complete the feedback loops of op-amps 138A and 138B results in comparators 150A and 150B failing to trigger. The triggering of comparator 150C raises the inputs of diodes 152CA-152CI to a relatively high voltage state, which brings the conduits to which they are attached (154AA, 154AB, 154AH, and 154AI in this case) to a relatively high voltage state, that is, to a state of "1" in binary logic terms. Thus, since these diodes 152CA-CI are connected to a unique combination of leads in digital signal bus 154, a digital signal uniquely identifying the cell among cells 120A-120C having the largest preliminary signal is applied to this bus. In this example, the signal applied is, reading left to right from conduit 154AA to 154AI, 110000011. A data pair has thus been provided: the magnitude of the filter element's output signal, in the form of the signal on analog signal bus 144, and the filter element's center frequency in the form of a digital number identifying the filter itself.

In FIG. 9, four groups consisting of 3 filter cells each are connected to four pairs of output signal buses. The cell having largest preliminary output signal in each group is identified by the digital signal produced on digital signal buses 154A-D. The magnitude of each largest preliminary output signal is indicated by a signal applied to analog voltage buses 144A-144D. Thus, four pairs of signals will be produced. Preferably, adjacent cells such as 120A, 160A, 170A, and 180A in FIG. 9 have filter elements 126 having adjacent transfer functions such as those shown in FIG. 7A. Each pair of signals on output bus pair 144 and 154 contains information as to the transfer function of the filter element (the digital signal identifies the cell containing the filter element) and information as to the signal magnitude produced by that filter element (the analog signal bus carries this information). Thus, the frequency of the signal present on R.F. distribution bus 123 can be calculated by one of the weighting method, the graphical method, or the manual or computer solutions, all described above. From this frequency, the speed of the gas stream in jet engine 18 is simply determined.

General Considerations

A brief description of the Doppler effect will first be given. The inventor does not assert that this explanation is strictly correct in terms of absolute science. Rather, it is an explanation which is sufficiently accurate to explain the functioning of the present invention.

Figure 1A:
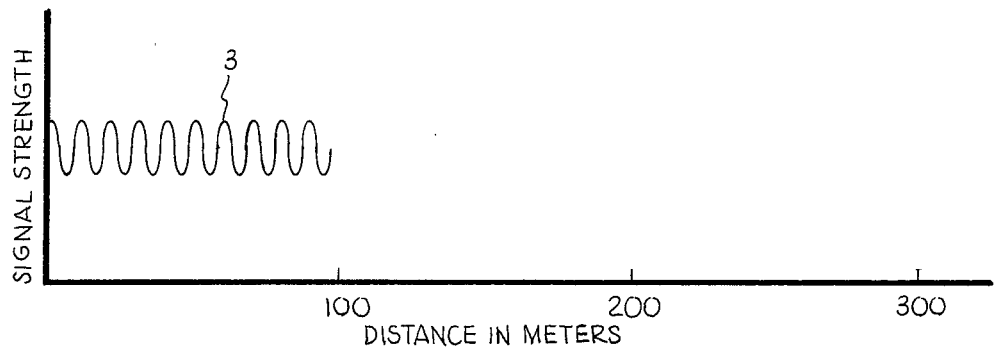
FIGS. 1A, 1B and 1C illustrate a wave burst traveling through space.
Figure 1B:
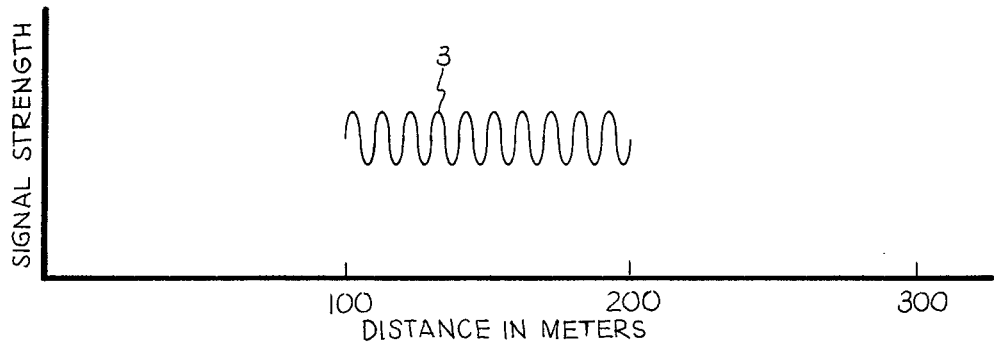
Figure 1C:
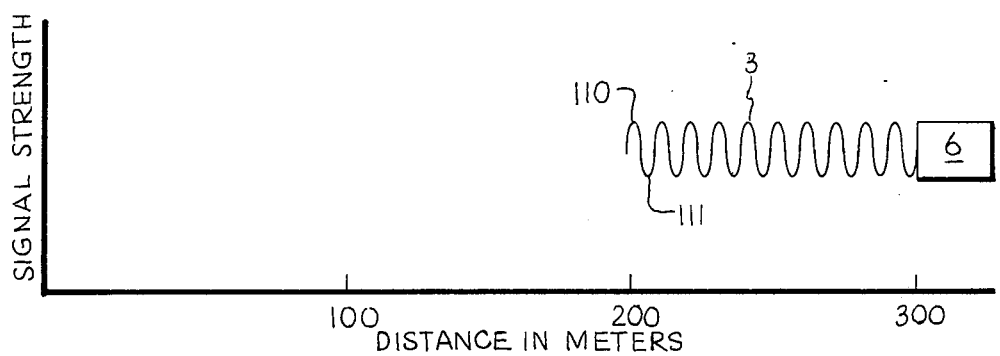

Electromagnetic radiation can travel through space. As schematically shown in FIG. 1A, a burst of radiation 3 of 1 sec. duration having a frequency of 10 cycles per sec. is shown traveling to the right at a speed of 100 meters per sec. At exactly 1.0 secs. after the burst first crosses the zero meter mark, it spans the distance from zero to 100 meters. At the 2nd second, as shown in FIG. 1B, the burst has travelled rightward and spans the distance from 100 to 200 meters, and at the third second, as shown in FIG. 1C, the burst spans the distance from 200 to 300 meters. If an object 6 is located at exactly the 300 meter mark, the burst can be reflected by the object 6 so that at the end of the fourth second, the burst will have travelled in the reverse direction to span the 100 to 200 meter marks, as shown in FIG. 1B, and at the end of the fifth second, it will span the 0 to 100 meter marks, as shown in FIG. 1A, and thus reach the zero meter mark at that time.

Reflection by the object 6 can be interpreted as interception by the object 6 followed by radiation therefrom. That is, the object can be viewed as a source of radiation. Let the 1 sec. burst of radiation be divided into ten equal fragments so that only 1/10th of the burst can be considered, which, in this case, is one cycle of radiation.

Figure 2:
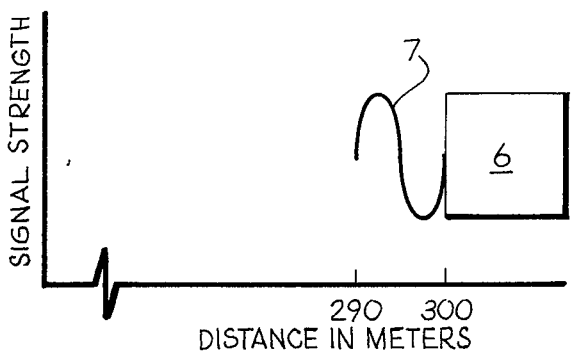
FIG. 2 illustrates a part of the burst of FIG. 1 being reflected by a stationary object.

As shown in FIG. 2, the stationary object 6 radiating such a burst fragment 7 will do so in 1/10th of a second so that the burst will extend between the 300 and 290 meter marks as shown.

Figure 3:
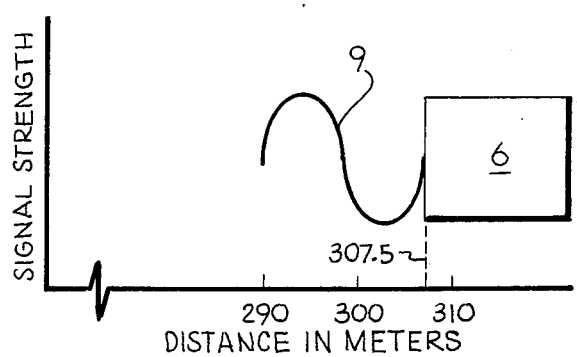
FIG. 3 illustrates a part of the burst of FIG. 1 being reflected by a moving object.

However, it has been found experimentally that if the object 6 is moving to the right, as shown in FIG. 3, at a speed of, for example, 75 meters per sec., or, equivalently, 7.5 meters per 1/10th of a sec., then during the 1/10th of a sec. in which it takes for the object to radiate the burst fragment, the object 6 will have traveled 7.5 meters. That is, at the end of this 1/10th second interval, the object 6 occupies the position shown in FIG. 3.

In this case, the wavelength, namely the distance from the beginning to the end of one full wave, of the radiated burst fragment has increased. The burst fragment now extends from marks 290 to 307.5, a distance of 17.5 meters, as opposed to extending from marks 290 to 300, a distance of 10 meters, in the case when the object was not moving. That is, in summary, radiation which is reflected by a moving object will change in wavelength.

The wavelength is related to the frequency and to the velocity of propagation of the radiation by the following equation $$L = V/f$$

wherein f indicates frequency, L indicates wavelength, and V indicates velocity of propagation. Since the velocity of propagation does not change in this example, a knowledge of the frequency f, will allow computation of the wavelength and thus of the object's velocity if the frequency of the radiation initially intercepted by the object is known. In the example above, measurement of the frequency of the wave, indicated as wave 9 in FIG. 3, will allow computation of the wavelength of the reflected wave. Thus, in the example above, it can be determined from the intercepted and the radiated frequencies that the object moved 7.5 meters in 1/10th sec., or, equivalently, 75 meters per sec.

The present invention is not limited to gas velocity measurement, but can be used to analyze the frequency of any short burst of radiation. As such, it has applications in radar and sonar tracking. Further, one embodiment of the invention has been described, but numerous modifications can be made without departing from the true spirit and scope of the present invention.

I claim:

1. A signal analyzer for determining the input frequency of an input signal comprising:

a first group of filter means, each having a predetermined frequency response characteristic, for producing a first identification signal which identifies the filter means in the first group having the greatest response to the input signal and for producing a first magnitude signal indicative of the magnitude of that response;

a second group of filter means, each having a predetermined frequency response characteristic, for producing a second identification signal which identifies the filter means in the second group having the greatest response and for producing a second magnitude signal indicative of the magnitude of that response; and regression analysis means coupled to said filter means for producing a signal in response to the identification and magnitude signals indicative of the frequency of the input signal.

2. A substantially real-time signal analyzer for determining the input frequency of an input signal comprising:

a distribution amplifier for amplifying said input signal and distributing it to a plurality of distribution conduits;

n groups of filter elements, each group connected to one of said distribution conduits, each filter element being responsive to a different band of frequencies, each having a predetermined frequency response characteristic, and each being productive of a preliminary signal in accordance with its response characteristic;

n groups of isolation means;

n groups of operational amplifiers, one input of each amplifier being coupled to one of the filter elements and the output of each operational amplifier being connected to the input of one of the isolation means;

n identity signal buses each connected to the outputs of all the isolation means in each group of isolation means;

n feedback means, each connected between the output of each isolation means and the second input of the respective operational amplifier connected to the input thereof, said feedback means and said isolation means functioning to select the amplification means in each group which produces the largest signal and to transmit that signal to the respective maximum signal bus;

n groups of comparator means, each of said comparator means being connected to the output of one of said amplification means for activation when the respective amplification means transmits its signal to its respective maximum signal bus;

n groups of encoding means, each of said encoding means productive of a signal identifying the filter means producing the largest signal in each of n groups;

regression means coupled to said encoding means and to said maximum signal buses for receiving signals therefrom and for producing a signal indicative of the frequency of said input signal in response.

3. Apparatus in accordance with claim 2 further comprising rectification means and ripple filter means connected between each of said filter elements and each of said amplifiers for reducing the ac component of the signal produced by each filter element.

4. Apparatus in accordance with claim 2 in which at least some of said amplifiers comprise operational amplifiers.

5. Apparatus in accordance with claim 2 in which said isolation means comprise diodes.

6. Apparatus in accordance with claim 2 in which said encoding means comprise leads connected between one output of each comparator means and a selected combination of leads contained in an identification bus.

7. Apparatus according to claim 3 or 4 and further comprising:

means for projecting a beam of substantially monochromatic light to a point for reflection therefrom;

reference means for generating a reference beam of substantially monochromatic light;

means for mixing said projected beam and said reference beam to produce the input signal having a frequency indicative of any difference in frequency between the two beams.

8. Apparatus in accordance with claim 7 in which said reference means comprises a beam splitter which generates said reference beam from said projected beam.

9. Apparatus in accordance with claim 7 and further comprising means for introducing matter into a fluid stream for reflecting said projected beam.

10. Apparatus in accordance with claim 9 and further comprising transducer means to determine the position of a reference system with respect to said projection means for locating the position of said point.

11. Apparatus according to claim 7 in which:
(a) the means for projecting the beam of substantially monochromatic light comprises:
  (i) a source for projecting the beam in a first direction;
  (ii) reflection means for directing the projected beam in a second direction;
  (iii) lens means used for focusing the projected beam at a predetermined point for reflection from the point;
(b) the means for generating the reference beam of substantially monochromatic light comprises:
  (i) beamsplitting means for separating a reference beam from the beam projected by the source;
(c) the mixing means comprises:
  (i) the lens means but used for focusing light reflected from the point toward the detector;
  (ii) beamsplitting means interposed between the lens means and the detector for transmitting the light reflected from the point to the detector and for reflecting the reference beam to the detector.

* * * * *

UNITED STATES PATENT AND TRADEMARK OFFICE
CERTIFICATE OF CORRECTION

PATENT NO. :  4,610,540
DATED      :  September 9, 1986
INVENTOR(S) :  Paul W. Mossey It is certified that error appears in the above-identified patent and that said Letters Patent is hereby corrected as shown below:

Column 10, line 59, claim 7, change numerals "3 and 4"
   to --1 and 2--; and

Column 11, line 8, claim 10, change the numeral "9" to --7--.

Signed and Sealed this

Seventh Day of April, 1987

Attest:

DONALD J. QUIGG

Attesting Officer

Commissioner of Patents and Trademarks